(12) United States Patent
Hiyoshi et al.

(10) Patent No.: US 10,381,445 B2
(45) Date of Patent: Aug. 13, 2019

(54) SILICON CARBIDE SEMICONDUCTOR DEVICE AND METHOD OF MANUFACTURING THE SAME

(71) Applicant: Sumitomo Electric Industries, Ltd., Osaka-shi (JP)

(72) Inventors: Toru Hiyoshi, Osaka (JP); Takashi Tsuno, Osaka (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 0 days.

(21) Appl. No.: 15/749,190

(22) PCT Filed: Aug. 3, 2016

(86) PCT No.: PCT/JP2016/072772
§ 371 (c)(1),
(2) Date: Jan. 31, 2018

(87) PCT Pub. No.: WO2017/051616
PCT Pub. Date: Mar. 30, 2017

(65) Prior Publication Data
US 2018/0233563 A1    Aug. 16, 2018

(30) Foreign Application Priority Data
Sep. 24, 2015  (JP) .................. 2015-186538

(51) Int. Cl.
*H01L 29/16* (2006.01)
*H01L 29/10* (2006.01)
*H01L 29/66* (2006.01)
*H01L 29/78* (2006.01)

(52) U.S. Cl.
CPC ...... *H01L 29/1608* (2013.01); *H01L 29/1095* (2013.01); *H01L 29/66068* (2013.01); *H01L 29/7802* (2013.01)

(58) Field of Classification Search
None
See application file for complete search history.

(56) References Cited

U.S. PATENT DOCUMENTS

2013/0140582 A1   6/2013  Kawakami et al.
2015/0214353 A1*  7/2015  Yamada ............ H01L 29/66068
                                                   257/77

FOREIGN PATENT DOCUMENTS

JP   2014-086483 A    5/2014
WO   2012/049872 A1   4/2012
WO   2014/105371 A1   7/2014

* cited by examiner

*Primary Examiner* — Anthony Ho
*Assistant Examiner* — Kevin Quinto
(74) *Attorney, Agent, or Firm* — Baker Botts L.L.P.; Michael A. Sartori

(57) ABSTRACT

A silicon carbide semiconductor device includes: a drift layer in contact with a first main surface and having a first conductivity type; a body region located in the drift layer, in contact with the first main surface, and having a second conductivity type; and a protruding portion having the second conductivity type and connected to a bottom of the body region. A manufacturing method includes forming, in the drift layer of a silicon carbide substrate, by ion implantation, the body region, the protruding portion, a JTE region, and at least one guard ring region, each having the second conductivity type.

15 Claims, 11 Drawing Sheets

SILICON CARBIDE SEMICONDUCTOR DEVICE AND METHOD OF MANUFACTURING THE SAME

TECHNICAL FIELD

The present invention relates to silicon carbide semiconductor devices and methods of manufacturing the same.

This application claims priority to Japanese Patent Application No. 2015-186538 filed on Sep. 24, 2015, the entire contents of which are incorporated herein by reference.

BACKGROUND ART

WO 2012/049872 (PTD 1), for example, discloses a semiconductor device having a RESURF (Reduced Surface Field) layer. This RESURF layer includes a plurality of layers surrounding an active region.

CITATION LIST

Patent Document

PTD 1: WO 2012/049872

SUMMARY OF INVENTION

A silicon carbide semiconductor device according to one embodiment of the present invention includes a silicon carbide substrate having a first main surface and a second main surface located opposite to the first main surface. The silicon carbide substrate includes: a first impurity region in contact with the first main surface and having a first conductivity type; a second impurity region located in the first impurity region, in contact with the first main surface, and having a second conductivity type different from the first conductivity type; a third impurity region having the second conductivity type and connected to a bottom of the second impurity region; an electric field relaxing region having the second conductivity type, located adjacent to the second impurity region, and having an impurity concentration lower than an impurity concentration in the third impurity region; and at least one guard ring region having the second conductivity type, located opposite to the second impurity region with the electric field relaxing region interposed therebetween, and having an impurity concentration lower than the impurity concentration in the third impurity region. The silicon carbide semiconductor device further includes: an oxide film located on the first main surface of the silicon carbide substrate, and having an opening to expose the second impurity region; a first electrode electrically connected to the second impurity region through the opening; and a second electrode electrically connected to the second main surface of the silicon carbide substrate.

A method of manufacturing a silicon carbide semiconductor device according to one embodiment of the present invention includes preparing a silicon carbide substrate having a first main surface and a second main surface located opposite to the first main surface. The silicon carbide substrate includes a first impurity region in contact with the first main surface and having a first conductivity type. The method of manufacturing a silicon carbide semiconductor device further includes forming, in the first impurity region, by ion implantation, a second impurity region, a third impurity region, an electric field relaxing region, and at least one guard ring region, each region having a second conductivity type different from the first conductivity type. The second impurity region is located in the first impurity region and in contact with the first main surface. The third impurity region is connected to a bottom of the second impurity region. The electric field relaxing region is located adjacent to the second impurity region, and has an impurity concentration lower than an impurity concentration in the third impurity region. The at least one guard ring region is located opposite to the second impurity region with the electric field relaxing region interposed therebetween, and has an impurity concentration lower than the impurity concentration in the third impurity region. The method of manufacturing a silicon carbide semiconductor device further includes: forming an oxide film on the first main surface of the silicon carbide substrate by thermal oxidation of the silicon carbide substrate; forming an opening in the oxide film so as to expose the second impurity region; forming a first electrode electrically connected to the second impurity region through the opening; and forming a second electrode electrically connected to the second main surface of the silicon carbide substrate.

DESCRIPTION OF EMBODIMENTS

Figure 1:
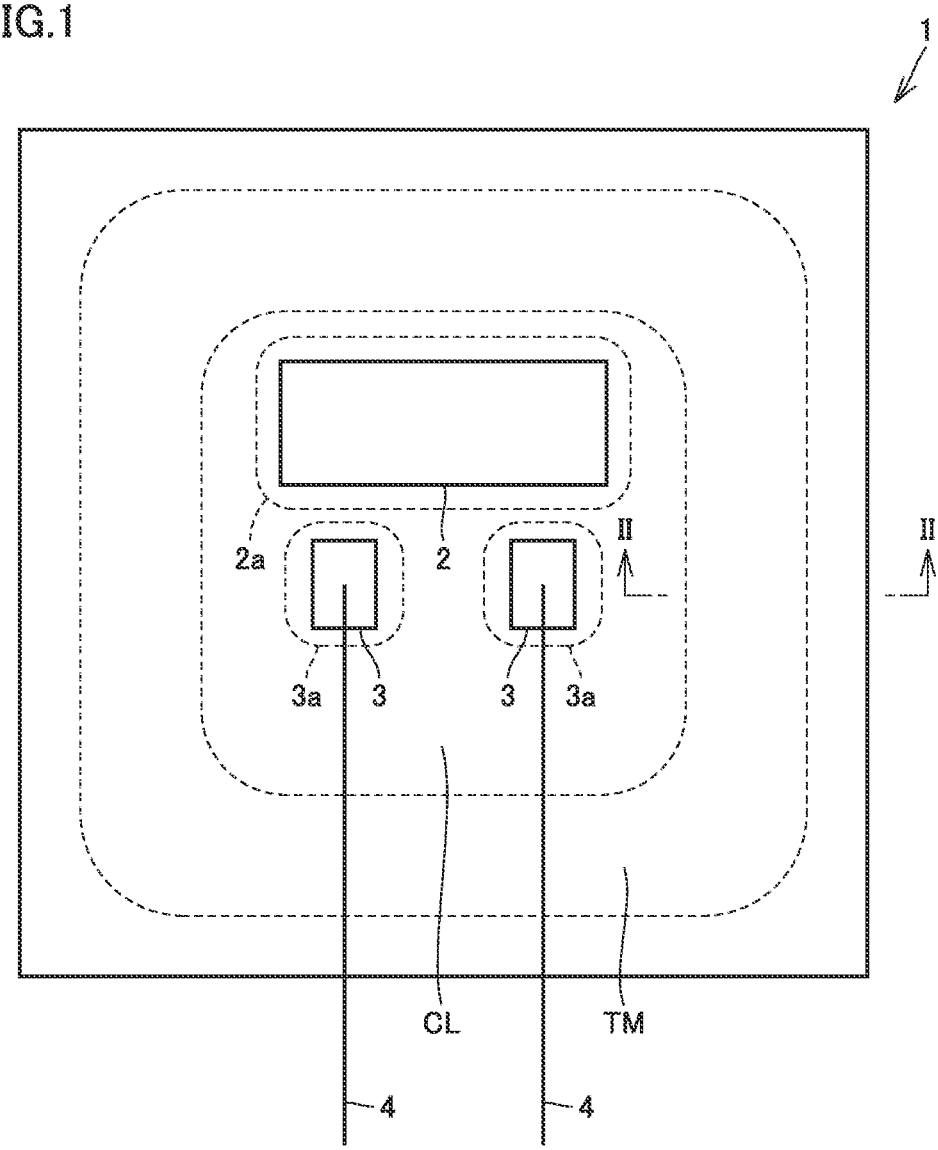
FIG. 1 is a schematic plan view of a silicon carbide semiconductor device according to one embodiment of the present invention.

Problems to be Solved by the Present Disclosure

In recent years, in order to achieve high breakdown voltage, low loss, and utilization of semiconductor devices under a high temperature environment, silicon carbide (SiC) has been increasingly adopted as a material forming a semiconductor device. In order to achieve high breakdown voltage of a semiconductor device, studies have been conducted on the structure of a semiconductor device, in addition to the material for a semiconductor device. In order to achieve high breakdown voltage, an electric field relaxing structure in a termination region of a semiconductor device is important.

In terms of improving reliability, it is required to increase withstand capability such as avalanche resistance of a power device. An object of the present disclosure is to provide a silicon carbide semiconductor device capable of achieving increased withstand capability and a method of manufacturing the same.

Effects of the Present Disclosure

According to the present disclosure, a silicon carbide semiconductor device capable of achieving increased withstand capability and a method of manufacturing the same can be provided.

Description of Embodiments of the Present Invention

Embodiments of the present invention will be described below with reference to the drawings. In the following description, the same or corresponding elements are designated by the same symbols and detailed description thereof will not be repeated.

Regarding crystallographic denotation herein, an individual orientation, a group orientation, an individual plane, and a group plane are shown in [ ], < >, ( ) and { }, respectively. Although a crystallographically negative index is normally expressed by a number with a bar "−" thereabove, a negative sign herein precedes a number to indicate a crystallographically negative index. Further, angles are described using a system having an omni-directional angle of 360 degrees.

First, the embodiments of the present invention will be listed and described.

(1) A silicon carbide semiconductor device according to one embodiment of the present invention includes a silicon carbide substrate (10) having a first main surface (12a) and a second main surface (11b) located opposite to the first main surface. The silicon carbide substrate includes: a first impurity region (12) in contact with the first main surface and having a first conductivity type; a second impurity region (13) located in the first impurity region, in contact with the first main surface, and having a second conductivity type different from the first conductivity type; a third impurity region (19) having the second conductivity type and connected to a bottom (13a) of the second impurity region; an electric field relaxing region (21) having the second conductivity type, located adjacent to the second impurity region, and having an impurity concentration lower than an impurity concentration in the third impurity region; and at least one guard ring region (22) having the second conductivity type, located opposite to the second impurity region with the electric field relaxing region interposed therebetween, and having an impurity concentration lower than the impurity concentration in the third impurity region. The silicon carbide semiconductor device further includes: an oxide film (15a, 15b) located on the first main surface of the silicon carbide substrate, and having an opening to expose the second impurity region; a first electrode (16) electrically connected to the second impurity region through the opening; and a second electrode (20) electrically connected to the second main surface of the silicon carbide substrate.

According to the above, the silicon carbide semiconductor device capable of achieving increased withstand capability can be provided. When avalanche breakdown occurs in the silicon carbide semiconductor device, a breakdown current flows. Avalanche breakdown is more likely to occur in a protruding portion than in the electric field relaxing region or the guard ring region. When avalanche breakdown occurs in the protruding portion, a breakdown current flows through the protruding portion and the second impurity region. Heat is generated by the breakdown current. The protruding portion is a region having a higher impurity concentration than the electric field relaxing region or the guard ring region. Accordingly, a path through which the breakdown current flows has a low electrical resistance value. Consequently, the amount of heat generated can be suppressed, so that the withstand capability of the silicon carbide semiconductor device can be increased.

(2) Preferably, with the first main surface as a depth reference position, the electric field relaxing region and the at least one guard ring region are shallower than the second impurity region.

According to the above, avalanche breakdown can be caused to occur more in the third impurity region than in the electric field relaxing region or the guard ring region.

(3) Preferably, the silicon carbide semiconductor device further includes a plurality of cells (7). Each of the plurality of cells includes the second impurity region and the third impurity region. The plurality of cells have a same concentration profile of the impurity of the second conductivity type in the third impurity region along a depth direction from the first main surface.

According to the above, avalanche breakdown can occur in the plurality of cells. A breakdown current is dispersed, and therefore it is expected that the withstand capability can be further increased.

(4) Preferably, a depth of a bottom (19a) of the third impurity region from the first main surface is not less than 0.9 μm.

According to the above, avalanche breakdown can be caused to occur more in the third impurity region than in the electric field relaxing region or the guard ring region.

(5) Preferably, a difference in depth from the first main surface between the bottom of the second impurity region and the bottom of the third impurity region is not less than 0.1 μm.

According to the above, the third impurity region can be clearly distinguished from the second impurity region. Thus, avalanche breakdown can be caused to occur more in the third impurity region than in the electric field relaxing region or the guard ring region.

(6) Preferably, the impurity of the second conductivity type in the third impurity region has a concentration of not more than $1 \times 10^{19}$ cm$^{-3}$.

According to the above, the withstand capability of the silicon carbide semiconductor device can be improved while the breakdown voltage is secured.

(7) Preferably, a dose amount of the impurity of the second conductivity type in the electric field relaxing region is not less than $0.5 \times 10^{13}$ cm$^{-2}$ and not more than $5 \times 10^{13}$ cm$^{-2}$.

According to the above, the breakdown voltage of the silicon carbide semiconductor device can be secured.

(8) A method of manufacturing a silicon carbide semiconductor device according to one embodiment of the present invention includes preparing (S10) a silicon carbide substrate (10) having a first main surface and a second main surface (11b) located opposite to the first main surface. The silicon carbide substrate includes a first impurity region (12) in contact with the first main surface and having a first conductivity type. The method of manufacturing a silicon carbide semiconductor device further includes forming (S20), in the first impurity region, by ion implantation, a second impurity region (13), a third impurity region (19), an electric field relaxing region (21), and at least one guard ring region (22), each region having a second conductivity type different from the first conductivity type. The second impurity region is located in the first impurity region and in contact with the first main surface. The third impurity region is connected to a bottom (13a) of the second impurity region. The electric field relaxing region is located adjacent to the second impurity region, and has an impurity concentration lower than an impurity concentration in the third impurity region. The at least one guard ring region is located opposite to the second impurity region with the electric field relaxing region interposed therebetween, and has an impurity concentration lower than the impurity concentration in the third impurity region. The method of manufacturing a silicon carbide semiconductor device further includes: forming (S30) an oxide film (15a, 15b) on the first main surface of the silicon carbide substrate by thermal oxidation of the silicon carbide substrate; forming (S40) an opening (30) in the oxide film so as to expose the second impurity region; forming (S50) a first electrode (16) electrically connected to the second impurity region through the opening; and forming (S50) a second electrode (20) electrically connected to the second main surface of the silicon carbide substrate.

According to the above, the silicon carbide semiconductor device capable of achieving increased withstand capability can be provided.

(9) Preferably, in the forming, with the first main surface as a depth reference position, the electric field relaxing region and the at least one guard ring region are formed to be shallower than the second impurity region.

According to the above, the third impurity region can be formed such that avalanche breakdown is more likely to occur in the third impurity region than in the electric field relaxing region or the guard ring region.

(10) Preferably, the silicon carbide semiconductor device further includes a plurality of cells (7). Each of the plurality of cells includes the second impurity region and the third impurity region. In the forming, the third impurity region is formed such that the plurality of cells have a same concentration profile of the impurity of the second conductivity type in the third impurity region along a depth direction from the first main surface.

According to the above, the third impurity region can be formed such that avalanche breakdown can occur in the plurality of cells.

(11) Preferably, a depth of a bottom (19a) of the third impurity region from the first main surface is not less than 0.9 μm.

According to the above, the third impurity region can be formed such that avalanche breakdown is more likely to occur in the third impurity region than in the electric field relaxing region or the guard ring region.

(12) Preferably, a difference in depth from the first main surface between the bottom of the second impurity region and the bottom of the third impurity region is not less than 0.1 μm.

According to the above, the third impurity region can be clearly distinguished from the second impurity region.

(13) Preferably, the impurity of the second conductivity type in the third impurity region has a concentration of not more than $1\times10^{19}$ cm$^{-3}$.

According to the above, the third impurity region can be formed such that the withstand capability of the silicon carbide semiconductor device is improved while the breakdown voltage is secured.

(14) Preferably, in the forming, a dose amount of the impurity of the second conductivity type in the electric field relaxing region is not less than $0.5\times10^{13}$ cm$^{-2}$ and not more than $5\times10^{13}$ cm$^{-2}$.

According to the above, the electric field relaxing region can be formed such that the breakdown voltage of the silicon carbide semiconductor device is secured.

Details of Embodiments of the Present Invention

FIG. 1 is a schematic plan view of a silicon carbide semiconductor device 1 according to one embodiment of the present invention. As shown in FIG. 1, silicon carbide semiconductor device 1 includes an element region CL and a termination region TM. Element region CL includes a plurality of MOSFET (Metal Oxide Semiconductor Field Effect Transistor) cells 7 (see FIG. 2). Termination region TM is provided on the outer side of element region CL and surrounds element region CL.

Silicon carbide semiconductor device 1 further includes a gate pad 2 and source pads 3. Source wires 4 are connected to source pads 3. A region 2a is a region directly below and in the vicinity of gate pad 2. Regions 3a are regions directly below and in the vicinity of source pads 3. Regions 2a and 3a will be described later in detail.

Figure 2:
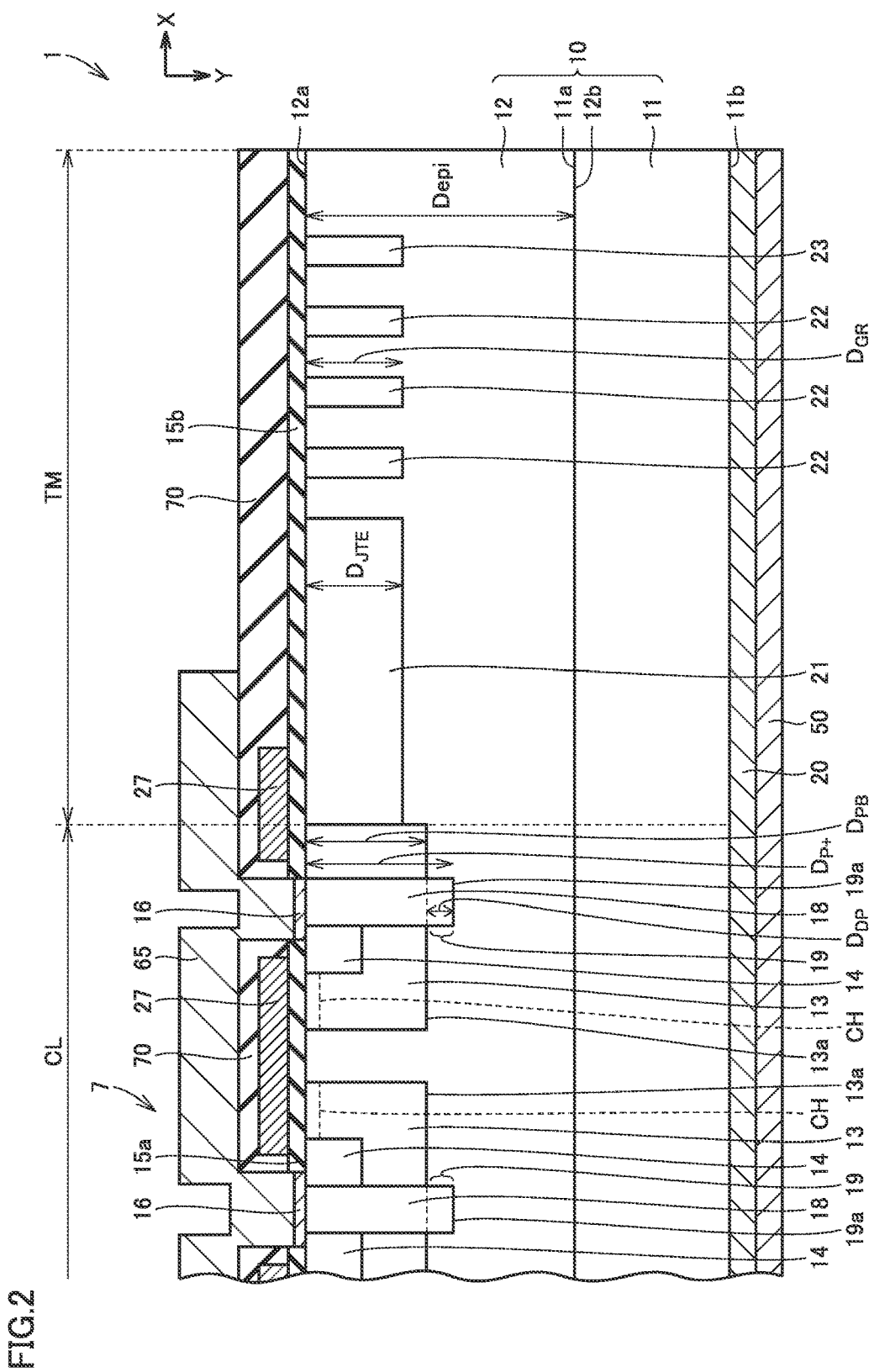
FIG. 2 is a schematic sectional view of a silicon carbide semiconductor device 1 according to one embodiment of the present invention, taken along the line II-II in FIG. 1.

FIG. 2 is a schematic sectional view of silicon carbide semiconductor device 1 according to one embodiment of the present invention, taken along the line II-II in FIG. 1. As shown in FIG. 2, silicon carbide semiconductor device 1 includes a silicon carbide substrate 10. Silicon carbide substrate 10 includes a silicon carbide single-crystal substrate 11 and a drift layer 12 (first impurity region).

Silicon carbide single-crystal substrate 11 is a semiconductor substrate made of, for example, hexagonal silicon carbide having a polytype of 4H. Silicon carbide single-crystal substrate 11 includes a first main surface 11a and a second main surface 11b. Second main surface 11b is located opposite to first main surface 11a.

Silicon carbide single-crystal substrate 11 has n type conductivity (first conductivity type). Silicon carbide single-crystal substrate 11 includes an impurity (donor) such as N (nitrogen). Silicon carbide single-crystal substrate 11 has an impurity concentration of about $1.0\times10^{18}$ cm$^{-3}$, for example.

Drift layer 12 is a silicon carbide layer and is made of, for example, hexagonal silicon carbide having a polytype of 4H. In one embodiment, drift layer 12 is an epitaxial layer having n type. Drift layer 12 is disposed on first main surface 11a of silicon carbide single-crystal substrate 11.

Drift layer 12 includes nitrogen, for example, as an impurity (donor). Drift layer 12 is lower in impurity concentration than silicon carbide single-crystal substrate 11. In one embodiment, drift layer 12 has an impurity concentration of about $1\times10^{14}$ cm$^{-3}$. Drift layer 12 has a thickness Depi of not less than about 10 μm and not more than about 35 μm.

Drift layer 12 has a first main surface 12a and a second main surface 12b. Second main surface 12b is located opposite to first main surface 12a, and in contact with first main surface 11a of silicon carbide single-crystal substrate 11.

In this embodiment, first main surface 12a of drift layer 12 corresponds to a first main surface of silicon carbide substrate 10. In other words, drift layer 12 is disposed in contact with the first main surface of silicon carbide substrate 10.

Second main surface 11b of silicon carbide single-crystal substrate 11 corresponds to a second main surface of silicon carbide substrate 10. The second main surface is located opposite to the first main surface.

As used herein, the term "below" means a direction from first main surface 12a of drift layer 12 toward second main surface 12b of drift layer 12. In FIG. 2 and the subsequently described figures, a Y direction indicates "below." Further, as used herein, the term "thickness" or "depth" means a length in the Y direction.

Silicon carbide semiconductor device 1 includes a body region 13 (second impurity region), a source region 14, a contact region 18, a JTE (Junction Termination Extension) region 21, a guard ring region 22, and a field stop region 23.

Body region 13 is disposed within drift layer 12 in contact with first main surface 12a of drift layer 12. In one embodiment, a depth $D_{PB}$ of body region 13 from first main surface 12a is not less than about 0.5 μm. Preferably, depth $D_{PB}$ is not more than about 1.0 μm.

Body region 13 has p type conductivity (second conductivity type) different from the n type conductivity. Body region 13 includes an impurity (acceptor) such as Al (aluminum) or B (boron). In one embodiment, body region 13 has an impurity concentration within the range of not less than about $5 \times 10^{17}$ cm$^{-3}$ and not more than about $1 \times 10^{18}$ cm$^{-3}$.

Source region 14 has n type conductivity. Source region 14 is disposed within body region 13, and is, together with body region 13, in contact with first main surface 12a of drift layer 12. Source region 14 is separated from drift layer 12 by body region 13.

As depth $D_{PB}$ of body region 13 decreases, the distance from a bottom of source region 14 to a bottom 13a of body region 13 decreases. Punch-through is more likely to occur, for example. Thus, depth $D_{PB}$ of body region 13 needs to be a certain depth. In one embodiment, depth $D_{PB}$ of body region 13 is not less than 0.8 μm.

Source region 14 includes an impurity such as P (phosphorus). The impurity included in source region 14 is higher in concentration than the impurity included in drift layer 12. As an example, source region 14 has an impurity concentration of about $1 \times 10^{20}$ cm$^{-3}$.

Contact region 18 has p type conductivity. Contact region 18 includes an impurity such as aluminum or boron.

In this embodiment, contact region 18 is, together with body region 13 and source region 14, in contact with first main surface 12a of drift layer 12. A depth $D_{P+}$ of contact region 18 is greater than depth $D_{PB}$ of body region 13 ($D_{P+} > D_{PB}$). That is, contact region 18 protrudes from bottom 13a of body region 13. In one embodiment, depth $D_{P+}$ is not less than 0.9 μm. Preferably, depth $D_{P+}$ is not less than 0.9 μm and not more than 1.5 μm. Consequently, as will be described later, avalanche breakdown is more likely to occur in contact region 18 than in JTE region 21 or guard ring region 22.

Contact region 18 has a protruding portion 19 (third impurity region) protruding from bottom 13a of body region 13. Protruding portion 19 is in contact with bottom 13a of body region 13. Protruding portion 19 is thus at a position deeper than body region 13. A depth $D_{DP}$ is the depth of a bottom 19a of protruding portion 19 with reference to bottom 13a of body region 13. Depth $D_{DP}$ corresponds to a difference in depth from main surface 12a between bottom 13a of body region 13 and bottom 19a of protruding portion 19. That is, $D_{DP} = D_{P+} - D_{PB}$ is satisfied. Depth $D_{DP}$ is preferably not less than 0.1 μm in order to ensure that protruding portion 19 exists at bottom 13a of body region 13. Depth $D_{DP}$ can be set appropriately depending on the breakdown voltage required of silicon carbide semiconductor device 1. In one example, depth $D_{DP}$ is about 0.5 μm.

The impurity included in contact region 18 may be higher in concentration than the impurity included in body region 13. Accordingly, protruding portion 19 may have a higher impurity concentration than the concentration of the impurity included in body region 13. In order to increase the impurity concentration, however, a dose amount of ion implantation needs to be increased. This may result in reduced crystallinity in drift layer 12. Alternatively, the ion implantation takes a longer time, which may result in reduced productivity.

In one example, protruding portion 19 has an impurity concentration of not more than about $1 \times 10^{19}$ cm$^{-3}$. For example, protruding portion 19 may have an impurity concentration of not less than about $5 \times 10^{13}$ cm$^{-3}$ and not more than about $1 \times 10^{19}$ cm$^{-3}$. Since protruding portion 19 has an impurity concentration within the above range, the withstand capability of silicon carbide semiconductor device 1 can be improved while the breakdown voltage is secured.

In contact region 18, a concentration profile of the impurity in the depth direction is not limited. For example, the impurity concentration may be reduced as the distance from main surface 12a increases. A peak of the impurity concentration in protruding portion 19 may be higher than the impurity concentration in bottom 13a of body region 13.

JTE region 21 is disposed within drift layer 12. JTE region 21 is in contact with first main surface 12a of drift layer 12. JTE region 21 corresponds to an electric field relaxing region for relaxing electric field concentration.

JTE region 21 has p type conductivity. JTE region 21 includes an impurity (acceptor) such as aluminum or boron. In one embodiment, a dose amount of the impurity in JTE region 21 is within the range of not less than about $0.5 \times 10^{12}$ cm$^{-2}$ and not more than about $5 \times 10^{13}$ cm$^{-2}$. The breakdown voltage of silicon carbide semiconductor device 1 can thereby be secured.

JTE region 21 is adjacent to body region 13. JTE region 21 is thus electrically connected to body region 13. A depth $D_{JTE}$ of JTE region 21 from first main surface 12a is smaller than depth $D_{PB}$ of body region 13 ($D_{JTE} < D_{PB}$). That is, JTE region 21 is shallower than body region 13. In one embodiment, depth $D_{JTE}$ is not less than 0.3 μm. Preferably, depth $D_{JTE}$ is not less than 0.3 μm and not more than 0.9 μm. Since JTE region 21 is shallower than body region 13, the likelihood of avalanche breakdown occurring in element region CL can be increased.

Guard ring region 22 is disposed on the outer side of JTE region 21 and surrounds JTE region 21. Guard ring region 22 is spaced from JTE region 21. In the configuration shown in FIG. 2, guard ring region 22 is in contact with first main surface 12a of drift layer 12. However, guard ring region 22 may be spaced from first main surface 12a of drift layer 12. The number of guard ring regions 22 or the impurity concentration in guard ring region 22 are set appropriately depending on the breakdown voltage required of silicon carbide semiconductor device 1. A dose amount of an impurity in guard ring region 22 may be substantially the same as the dose amount of the impurity in JTE region 21. In one embodiment, the dose amount of the impurity in guard ring region 22 is not less than about $0.5 \times 10^{12}$ cm$^{-2}$ and not more than about $5 \times 10^{13}$ cm$^{-2}$.

A depth $D_{GR}$ of guard ring region 22 from first main surface 12a is smaller than depth $D_{PB}$ of body region 13 ($D_{GR}<D_{PB}$). That is, guard ring region 22 is shallower than body region 13. In one embodiment, depth $D_{GR}$ may be substantially the same as depth $D_{JTE}$. However, depth $D_{GR}$ may be different from depth $D_{JTE}$.

Field stop region 23 has n type conductivity. Field stop region 23 is disposed on the outer side of guard ring region 22. Field stop region 23 has n type conductivity. Field stop region 23 may be omitted.

Silicon carbide semiconductor device 1 further includes a gate insulating film 15a, an insulating film 15b, a source electrode 16, a gate electrode 27, a source pad electrode 65, a drain electrode 20, a backside protection electrode 50, and an interlayer insulating film 70. Cell 7 includes body region 13, contact region 18, source region 14, gate insulating film 15a, gate electrode 27, and source electrode 16.

Gate insulating film 15a covers a surface of at least a channel region CH of body region 13. Channel region CH is a portion of body region 13 which is sandwiched between drift layer 12 and source region 14. Gate insulating film 15a is an oxide film made of silicon dioxide, for example. Gate insulating film 15a has a thickness of about 50 nm, for example.

Gate insulating film 15a is in contact with body region 13, source region 14 and drift layer 12 so as to extend from source region 14 formed in one of two adjacent body regions 13 to source region 14 formed in the other body region 13. Accordingly, gate insulating film 15a is disposed on channel region CH of each of two adjacent body regions 13.

Gate electrode 27 is disposed in contact with gate insulating film 15a. Gate electrode 27 is disposed to face the source region and channel region CH of each of two adjacent body regions 13, as well as a portion of drift layer 12 which is sandwiched between those two body regions 13. In addition, gate electrode 27 is disposed to straddle body region 13 and JTE region 21. Gate electrode 27 is made of a conductor such as polysilicon doped with an impurity, or aluminum.

Source electrode 16 is in contact with source region 14 and contact region 18. Source electrode 16 is electrically connected to source region 14 and contact region 18. Preferably, source electrode 16 is made of a material having nickel and silicon. Source electrode 16 may be made of a material having titanium, aluminum and silicon. Preferably, source electrode 16 is in ohmic contact with source region 14 and contact region 18.

Insulating film 15b is disposed on first main surface 12a of drift layer 12, and covers part of body region 13, JTE region 21, guard ring region 22, and field stop region 23. Insulating film 15b is an oxide film made of silicon dioxide ($SiO_2$). Insulating film 15b may have the same thickness as gate insulating film 15a.

At an interface between insulating film 15b and JTE region 21, and an interface between insulating film 15b and guard ring region 22, it is preferable that an interface fixed charge exist at a density of not more than $5 \times 10^{12}$ $cm^{-2}$, for example. The dose amount in JTE region 21 and guard ring region 22 may vary in the manufacturing process. With the variation in dose amount, the breakdown voltage of silicon carbide semiconductor device 1 also tends to vary. By reducing the interface fixed charge, the variation in dose amount of the second conductivity type impurity for each silicon carbide semiconductor device 1 can be reduced.

Interlayer insulating film 70 is disposed on gate insulating film 15a and covers gate electrode 27. Interlayer insulating film 70 is also disposed on insulating film 15b.

Source pad electrode 65 is in contact with source electrode 16 and covers interlayer insulating film 70. Source pad electrode 65 is made of aluminum, for example. Source pad electrode 65 and source electrode 16 may be integrated together.

Drain electrode 20 is disposed in contact with second main surface 11b of silicon carbide single-crystal substrate 11. Drain electrode 20 is electrically connected to silicon carbide single-crystal substrate 11, and electrically connected to drift layer 12 through silicon carbide single-crystal substrate 11. Drain electrode 20 may have a similar configuration to source electrode 16, for example. Instead, drain electrode 20 may be made of another material such as nickel, which is capable of making ohmic contact with silicon carbide single-crystal substrate 11.

Backside protection electrode 50 is disposed in contact with drain electrode 20. Backside protection electrode 50 is electrically connected to drain electrode 20. Backside protection electrode 50 is made of, for example, titanium, nickel, silver, or an alloy thereof.

Figure 3:
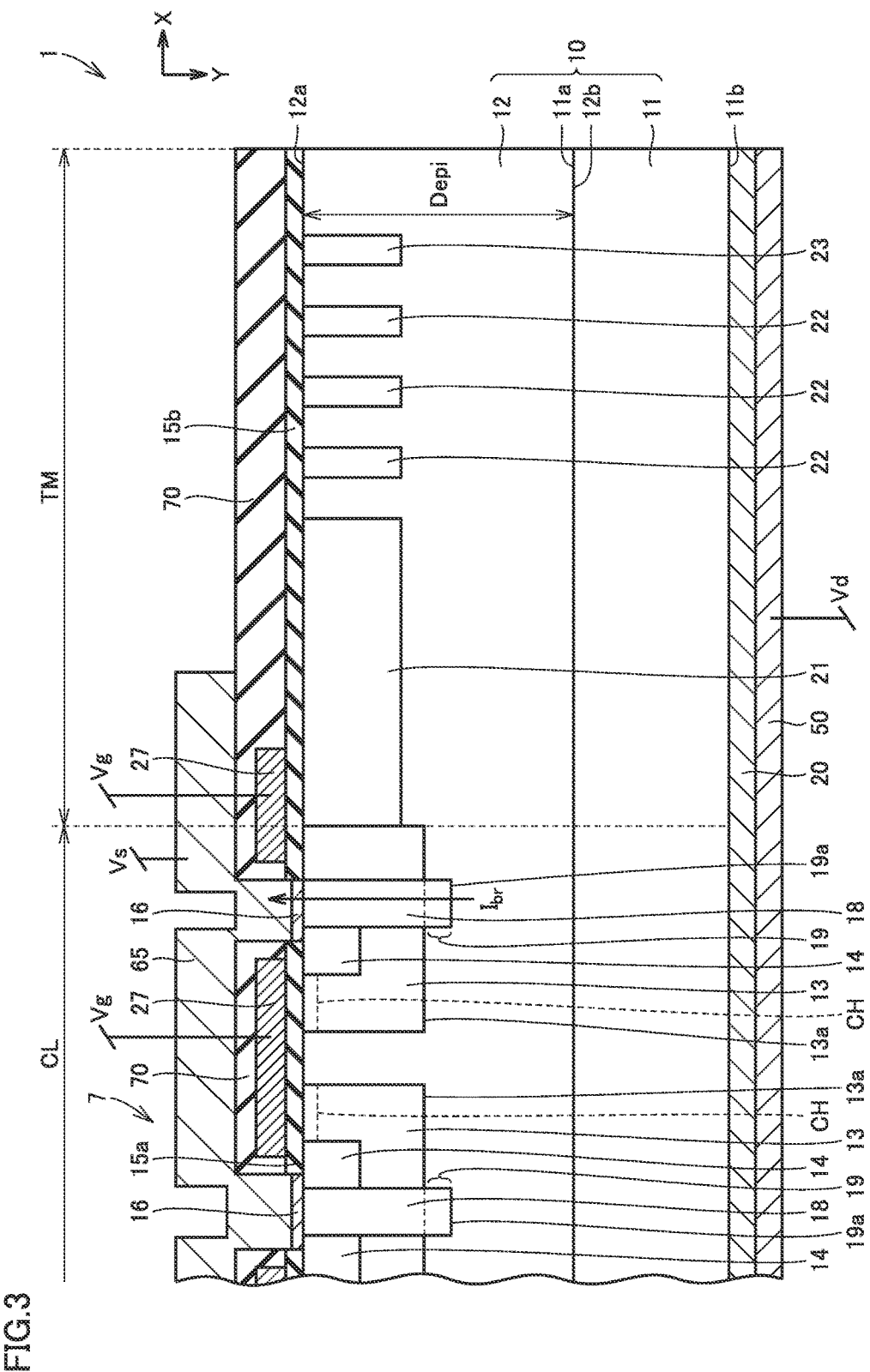
FIG. 3 is a schematic diagram illustrating improvement in withstand capability of the silicon carbide semiconductor device according to one embodiment of the present invention.

FIG. 3 is a schematic diagram illustrating improvement in withstand capability of silicon carbide semiconductor device 1 according to one embodiment of the present invention. As shown in FIG. 3, a drain voltage Vd is applied through backside protection electrode 50 and drain electrode 20 to silicon carbide single-crystal substrate 11 and drift layer 12. A gate voltage Vg is applied to gate electrode 27. A source voltage Vs is applied through source pad electrode 65 and source electrode 16 to source region 14 and contact region 18. Source voltage Vs is applied through contact region 18 to body region 13.

Gate insulating film 15a is sandwiched between body region 13 and gate electrode 27. A voltage applied to gate insulating film 15a is a voltage corresponding to a difference between gate voltage Vg and source voltage Vs. This voltage is controlled such that it does not exceed a dielectric voltage of gate insulating film 15a.

In this embodiment, silicon carbide semiconductor device 1 is an n channel type MOSFET. When silicon carbide semiconductor device 1 is used, drain voltage Vd becomes higher than source voltage Vs. Accordingly, drain voltage Vd becomes higher than source voltage Vs when silicon carbide semiconductor device 1 is used at a high voltage.

Body region 13 and JTE region 21 are electrically connected. The voltage of each of body region 13 and JTE region 21 is lower than drain voltage Vd. Accordingly, a reverse bias voltage is applied between drift layer 12 and body region 13. A reverse bias voltage is similarly applied between drift layer 12 and contact region 18, and between drift layer 12 and JTE region 21.

The breakdown voltage of silicon carbide semiconductor device 1 depends on the thickness of drift layer 12. Contact region 18 has protruding portion 19. The thickness of drift layer 12 is the smallest directly below protruding portion 19. Avalanche breakdown tends to occur directly below protruding portion 19.

Moreover, in this embodiment, contact region 18, JTE region 21 and guard ring region 22 are in contact with a common plane (first main surface 12a). Consequently, avalanche breakdown tends to occur at protruding portion 19 of contact region 18.

When avalanche breakdown occurs directly below protruding portion 19, a breakdown current $I_{br}$ flows from drift layer 12 through contact region 18 and source electrode 16 to source pad electrode 65.

Heat is generated by breakdown current $I_{br}$ flowing through contact region 18. Contact region 18 is higher in impurity concentration than body region 13 and JTE region 21. Contact region 18 is thus smaller in resistance value than body region 13 and JTE region 21. Accordingly, the amount of heat generated can be further reduced than when breakdown current $I_{br}$ flows through JTE region 21. According to this embodiment, therefore, the withstand capability of the silicon carbide semiconductor device can be increased. With the increased withstand capability, a safety operation area (SOA) of the silicon carbide semiconductor device can be expanded.

Figure 4:
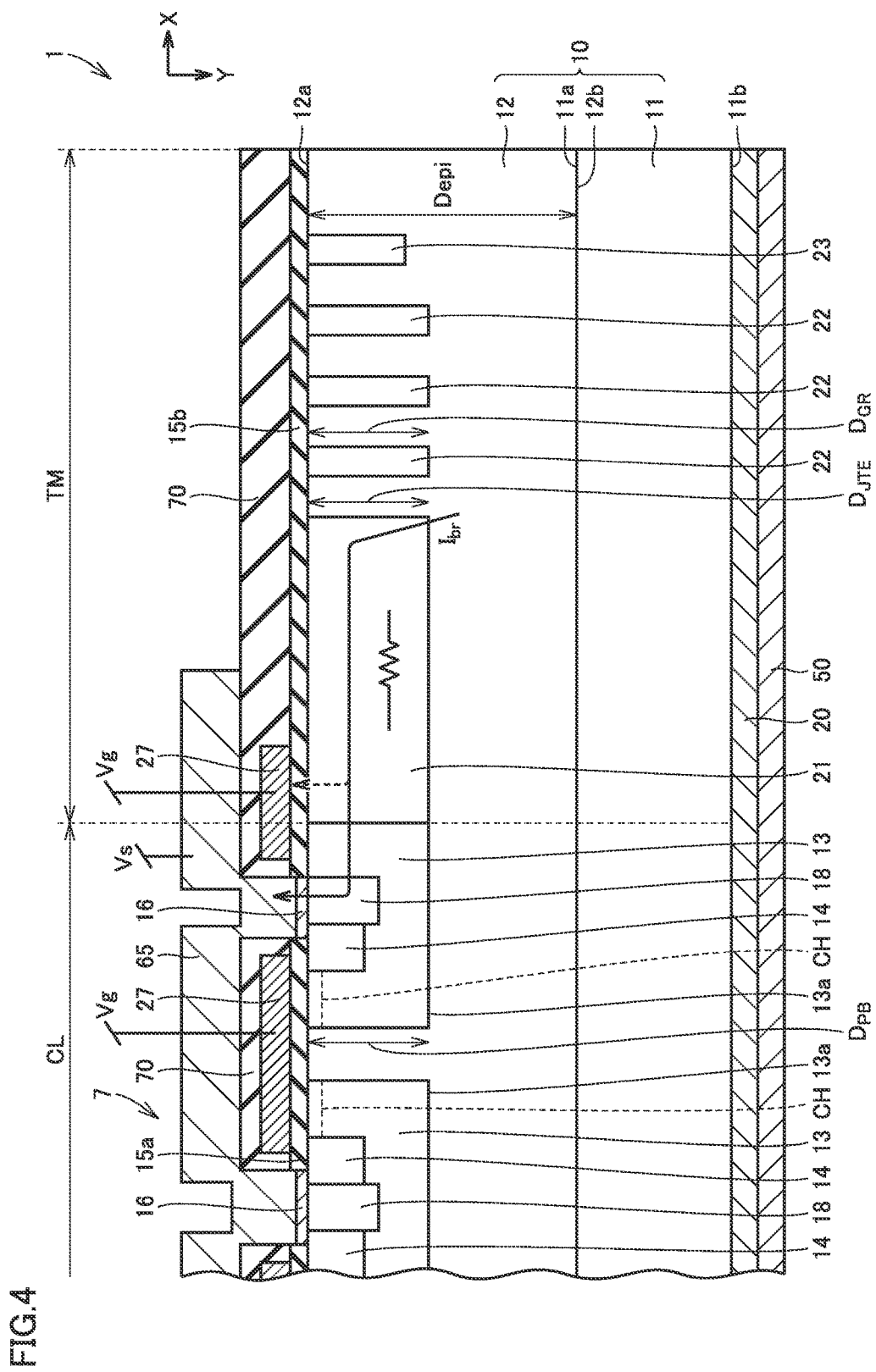
FIG. 4 is a sectional view showing one structural example of the silicon carbide semiconductor device.

FIG. 4 is shown to better clarify the advantages of silicon carbide semiconductor device 1 according to the first embodiment of the present invention. FIG. 4 is a sectional view showing one structural example of the silicon carbide semiconductor device. As shown in FIG. 4, contact region 18 is disposed within body region 13. That is, contact region 18 does not have protruding portion 19. Moreover, depth $D_{JTE}$ of JTE region 21 and depth $D_{GR}$ of the guard ring are the same as depth $D_{PB}$ of body region 13.

In the configuration shown in FIG. 4, avalanche breakdown tends to occur in termination region TM. For example, avalanche breakdown occurs in JTE region 21. In this case, breakdown current $I_{br}$ flows through JTE region 21 and body region 13.

JTE region 21 and body region 13 are lower in impurity concentration than contact region 18. Moreover, the length of JTE region 21 in an X direction is greater than depth $D_{P+}$ of contact region 18 shown in FIG. 2. Thus, JTE region 21 is a high-resistance region. Heat is generated by breakdown current $I_{br}$ flowing through JTE region 21. A greater amount of heat tends to be generated than when breakdown current $I_{br}$ flows through contact region 18. Silicon carbide semiconductor device 1 thus tends to be thermally damaged.

Moreover, by application of a high reverse bias voltage to silicon carbide substrate 10, an electric field between JTE region 21 and gate electrode 27 increases. It is assumed that a voltage of several thousand volts, for example (about 6 kV, for example), is applied within silicon carbide substrate 10. Insulating film 15b is formed of an oxide film (silicon dioxide film). Insulating film 15b has substantially the same thickness (40 nm, for example) as gate insulating film 15a. There is a likelihood that dielectric breakdown of insulating film 15b will occur by application of a high electric field to insulating film 15b. When the dielectric breakdown of insulating film 15b occurs, a leak current (indicated by a broken line arrow) flows from JTE region 21 to gate electrode 27.

As described in above, in this embodiment, breakdown can be caused to occur in contact region 18 (protruding portion 19) within element region CL. Accordingly, in addition to increasing the withstand capability of silicon carbide semiconductor device 1, the likelihood of dielectric breakdown of insulating film 15b can be reduced.

Figure 5:
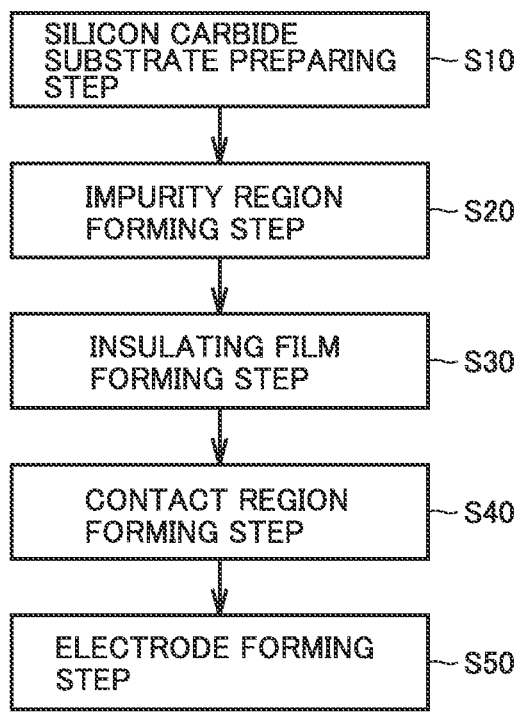
FIG. 5 is a flowchart illustrating a method of manufacturing the silicon carbide semiconductor device according to the embodiment.
Figure 6:
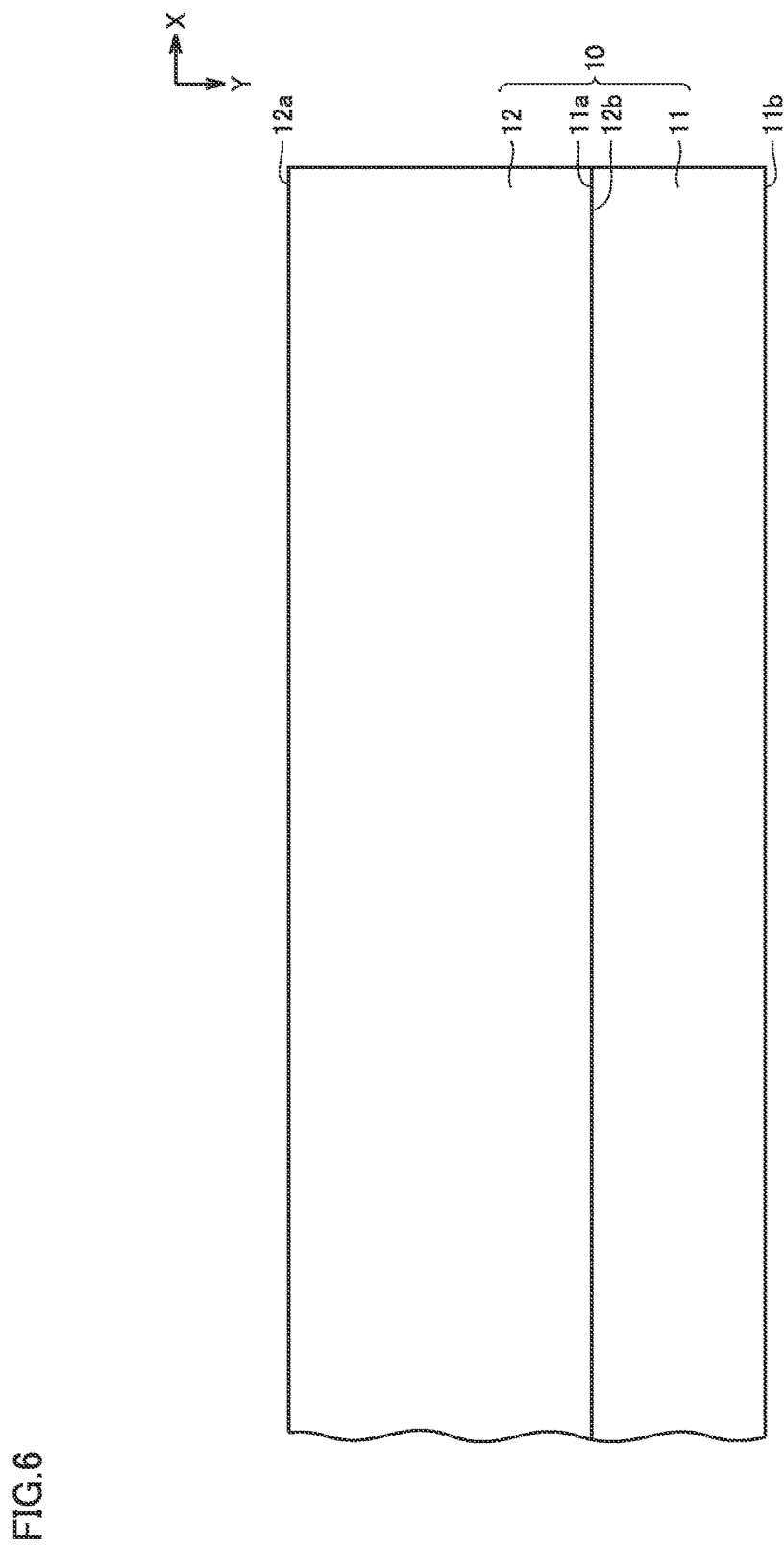
FIG. 6 is a sectional view of a silicon carbide substrate for illustrating a silicon carbide single-crystal substrate preparing step.

FIG. 5 is a flowchart illustrating a method of manufacturing silicon carbide semiconductor device 1 according to this embodiment. As shown in FIG. 5, a step of preparing a silicon carbide substrate (S10) is performed first. As shown in FIG. 6, silicon carbide single-crystal substrate 11 made of hexagonal silicon carbide having a polytype of 4H, for example, is prepared. Silicon carbide single-crystal substrate 11 has first main surface 11a and second main surface 11b. Then, a silicon carbide epitaxial layer of n type (first conductivity type) (drift layer 12) is formed on first main surface 11a by epitaxial growth. First main surface 12a of drift layer 12 forms the first main surface of silicon carbide substrate 10. Second main surface 11b of silicon carbide single-crystal substrate 11 forms the second main surface of silicon carbide substrate 10. The first main surface of silicon carbide substrate 10 (first main surface 12a of drift layer 12) is a plane angled off by not more than about 8° relative to a (0001) plane, for example.

Figure 7:
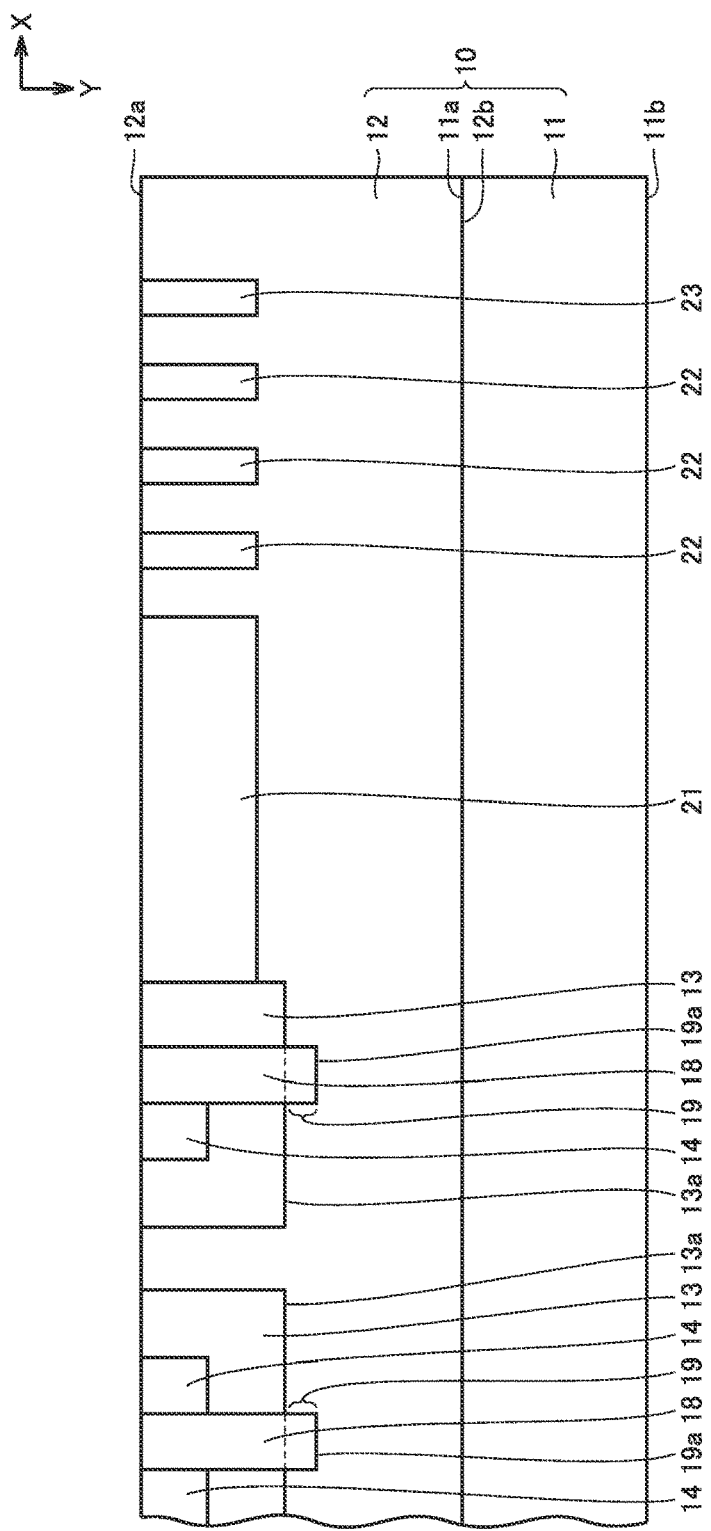
FIG. 7 is a sectional view of the silicon carbide substrate for illustrating an impurity region forming step.

Next, a step of forming an impurity region (S20: FIG. 5) is performed. As shown in FIG. 7, ions are selectively implanted into first main surface 12a of drift layer 12 by photolithography and ion implantation. A nitrogen annealing step may be performed after each ion implantation step.

For example, ions of a p type impurity such as aluminum are selectively implanted into drift layer 12. Body region 13 is thereby formed. In one embodiment, the p type impurity is implanted into drift layer 12 such that the depth of bottom 13a of body region 13 from first main surface 12a is not less than 0.9 μm.

Similarly, ions of a p type impurity such as aluminum are selectively implanted into drift layer 12. JTE region 21 and guard ring region 22 are thereby formed. In one embodiment, a dose amount of the p type impurity ions for forming JTE region 21 and guard ring region 22 is not less than $0.5 \times 10^{13}$ cm$^{-2}$ and not more than $5 \times 10^{13}$ cm$^{-2}$.

The ion implantation for forming JTE region 21 and guard ring region 22 is lower in energy than the ion implantation for forming body region 13. Thus, JTE region 21 and guard ring region 22 are formed to be shallower than body region 13.

JTE region 21 is formed adjacent to body region 13. The order in which body region 13 and JTE region 21 are formed is not limited. JTE region 21 and guard ring region 22 may be formed either subsequent to or prior to body region 13.

Moreover, ions of an n type impurity such as phosphorus are implanted into drift layer 12. Field stop region 23 is thereby formed. Similarly, ions of an n type impurity such as phosphorus are implanted into body region 13. Source region 14 is thereby formed.

Ions of a p type impurity such as aluminum are implanted into source region 14. Contact region 18 is thereby formed. The ion implantation for forming contact region 18 is higher in energy than the ion implantation for forming body region 13. Protruding portion 19 protruding from bottom 13a of body region 13 can thereby be formed.

Protruding portion 19 is formed, for example, such that the distance from bottom 13a of body region 13 to bottom 19a of protruding portion 19 is not less than 0.1 μm. The plurality of cells 7 (see FIG. 2) can have the same concentration profile of protruding portion 19. In one embodiment, protruding portion 19 is formed so as to have a p type impurity concentration of not more than $1 \times 10^{19}$ cm$^{-3}$.

Figure 8:
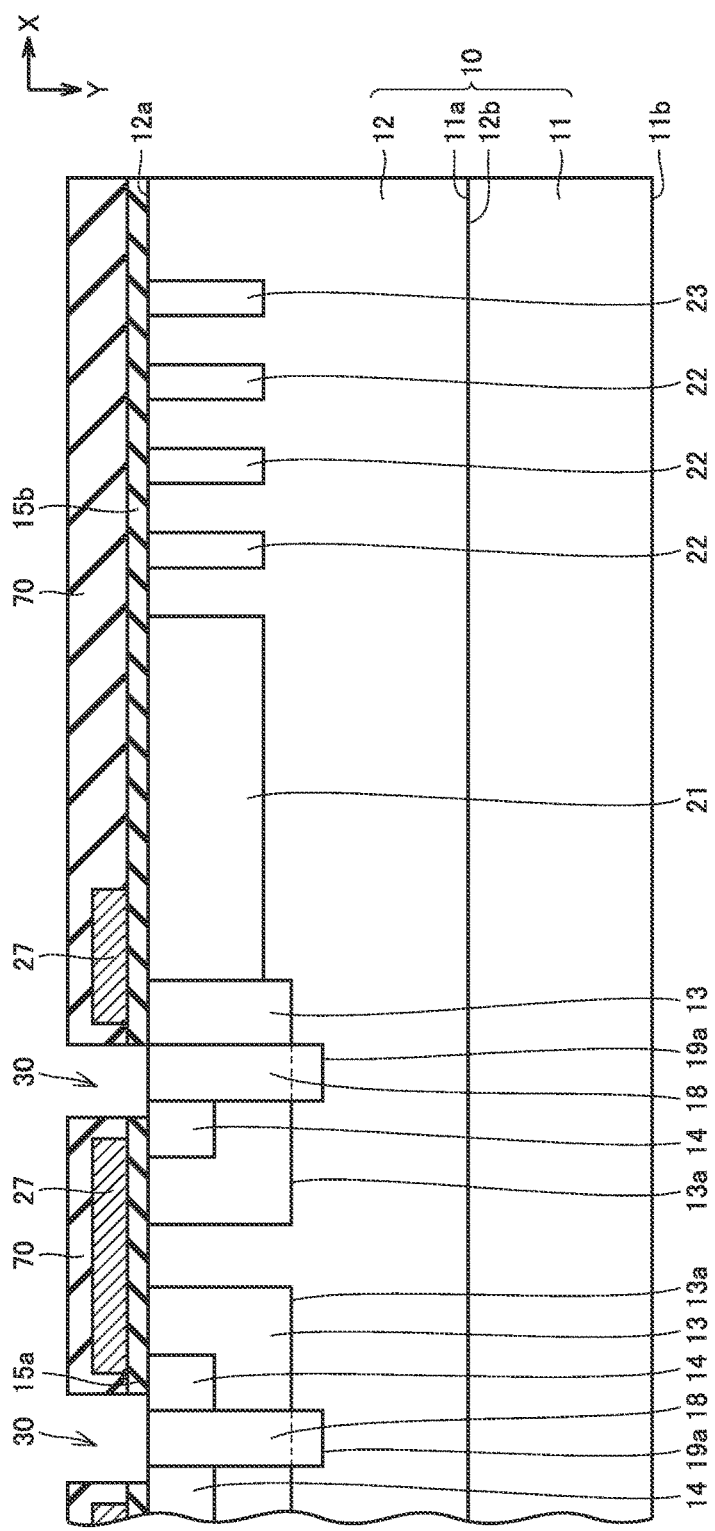
FIG. 8 is a sectional view of the silicon carbide substrate for illustrating an insulating film forming step and a contact region forming step.

Next, a step of forming an insulating film (S30: FIG. 5) is performed. As shown in FIG. 8, gate insulating film 15a and insulating film 15b are formed on drift layer 12. Specifically, silicon carbide substrate 10 is held at a temperature of about 1300° C. for about one hour, for example, in an oxygen atmosphere. First main surface 12a of drift layer 12 is thermally oxidized to form gate insulating film 15a and insulating film 15b. Then, a polysilicon film doped with an impurity is formed on gate insulating film 15a by CVD (Chemical Vapor Deposition), for example. Gate electrode 27 is formed in photolithography and etching steps. Subsequently, a step of forming interlayer insulating film 70 is performed. Interlayer insulating film 70 made of silicon dioxide is formed by CVD, for example, so as to cover gate electrode 27.

Next, a step of forming a contact region (S40: FIG. 5) is performed. An opening 30 is formed in interlayer insulating film 70 and gate insulating film 15a by photolithography and etching, so as to expose contact region 18 and source region 14.

Next, a step of forming an electrode (S50: FIG. 5) is performed. A metal layer is formed by sputtering, for example, on the first main surface of silicon carbide substrate 10 (first main surface 12a of drift layer 12). The metal layer may include a Ti (titanium) layer, an Al (aluminum) layer and a Si (silicon) layer, for example. Annealing may be performed after the metal layer has been formed. Source electrode 16 is thereby formed.

After source electrode 16 has been formed, a step of forming source pad electrode 65 is performed. Source pad electrode 65 made of a material including aluminum, for example, is formed. Then, drain electrode 20 is formed on second main surface 11b of silicon carbide single-crystal substrate 11. Subsequently, backside protection electrode 50 is formed on drain electrode 20. By the procedure described above, silicon carbide semiconductor device 1 shown in FIGS. 1 and 2 is completed.

Figure 9:
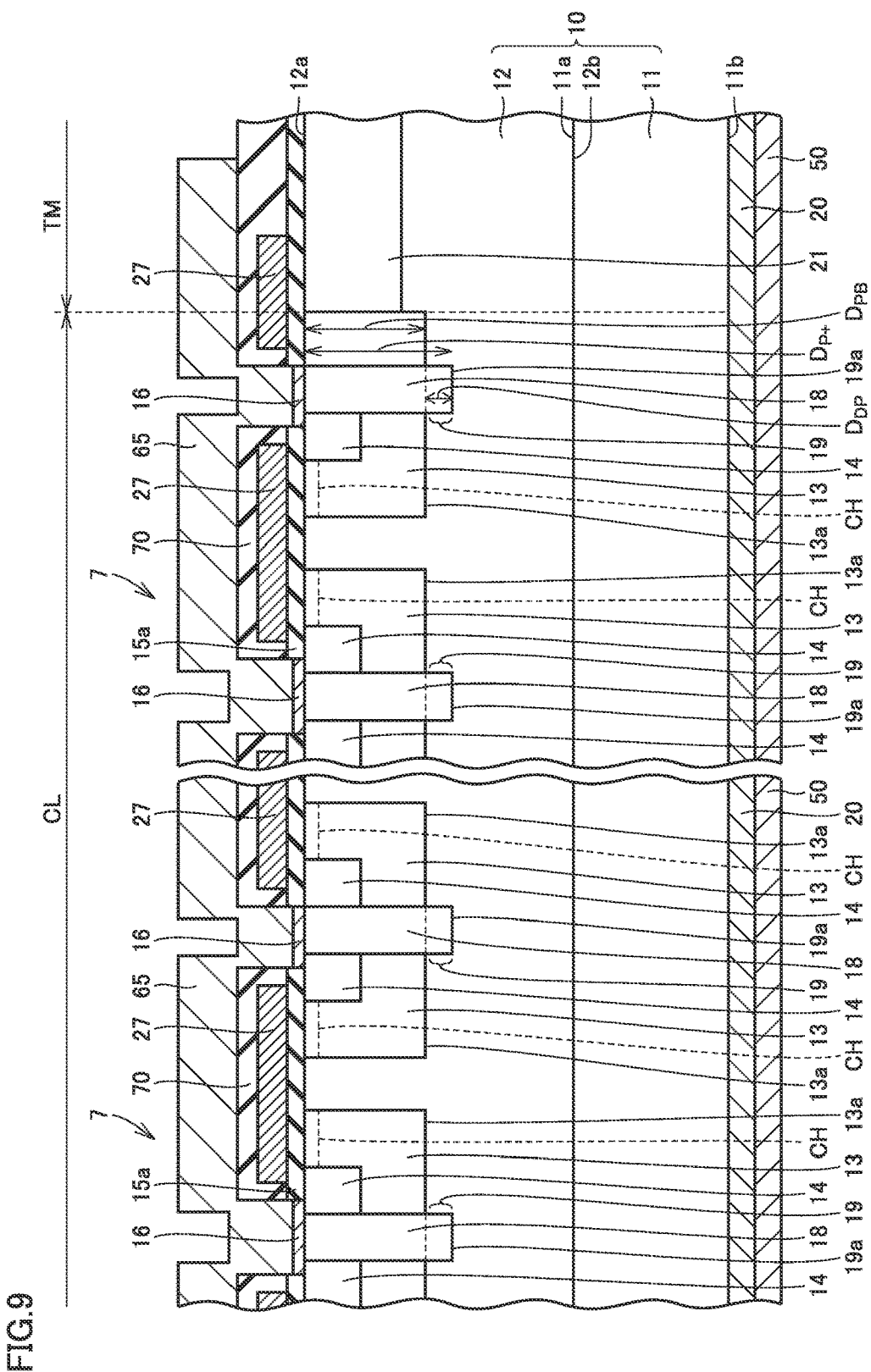
FIG. 9 is a sectional view of the silicon carbide substrate for illustrating an example of the configuration of each cell in a central portion of an element region.

FIG. 2 shows the configuration of a peripheral portion of element region CL. The configuration of a central portion of element region CL is now described. As shown in FIG. 9, the configuration of each cell 7 in the central portion of element region CL is identical to the configuration in the peripheral portion of element region CL. In the central portion of element region CL, contact region 18 has protruding portion 19 connected to bottom 13a of body region 13.

Each of contact regions 18 of the plurality of cells 7 within element region CL may have protruding portion 19. In other words, each of contact regions 18 has the same concentration profile of the impurity of the second conductivity type. According to such a configuration, avalanche breakdown can occur at a plurality of locations within element region CL. In this case, a breakdown current can be dispersed. It is therefore expected that the withstand capability can be further increased. Moreover, the plurality of contact regions 18 can be formed in the same step.

Figure 10:
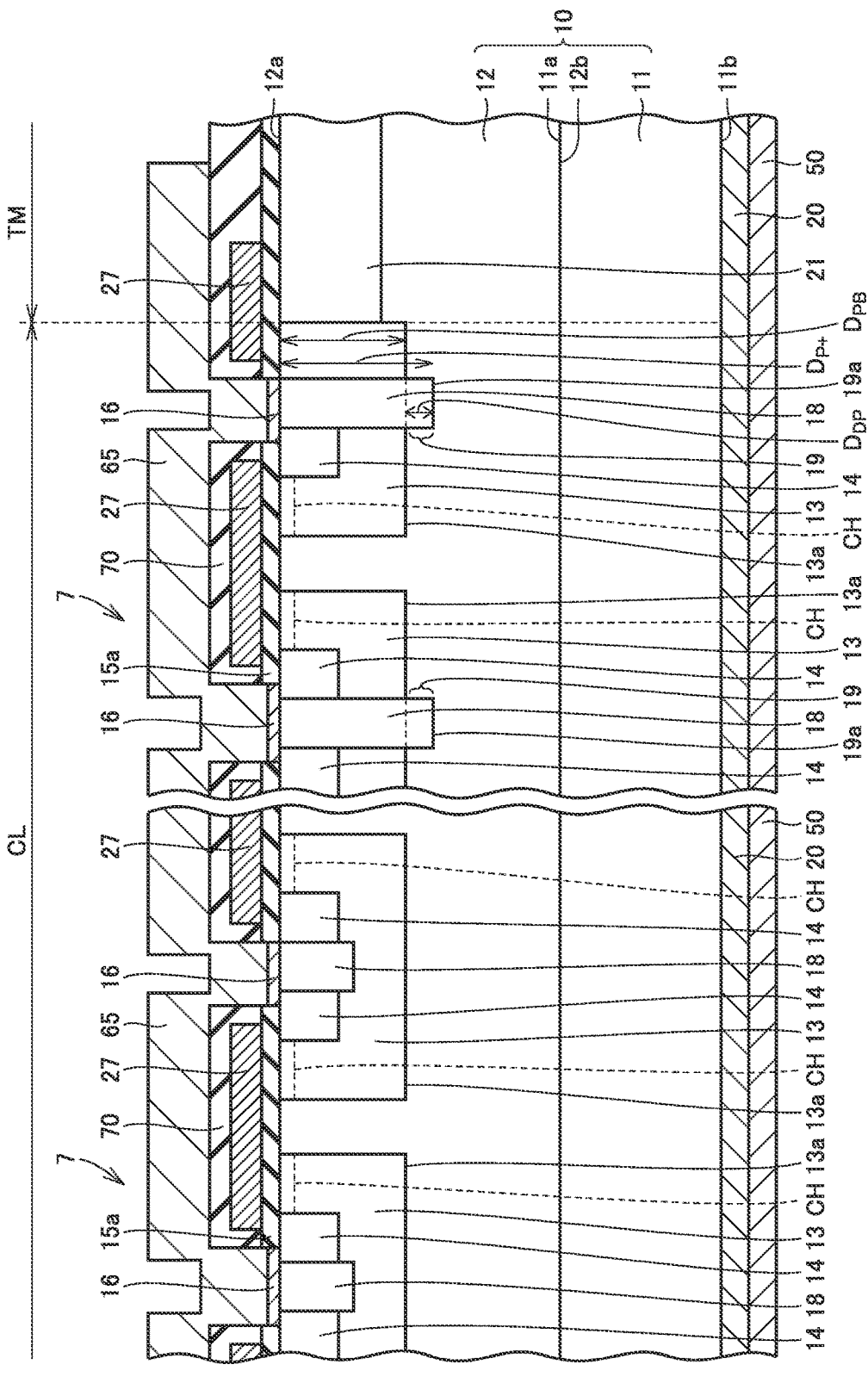
FIG. 10 is a diagram showing another example of the configuration of each cell in the element region.

FIG. 10 is a diagram showing another example of the configuration of each cell in element region CL. As shown in FIG. 10, in cell 7 in the central portion of element region CL, contact region 18 may be disposed within body region 13. That is, cell 7 in the central portion of element region CL does not have protruding portion 19. According to this configuration, the occurrence of avalanche breakdown can be facilitated at the peripheral portion of element region CL, that is, at a portion near the boundary between element region CL and termination region TM.

By combining the configurations shown in FIGS. 9 and 10 together, a location where avalanche breakdown tends to occur can be created within element region CL. Referring back to FIG. 1, when avalanche breakdown occurs in region 2a, for example, it is more likely that gate insulating film 15a will be damaged. Thus, in region 2a, contact region 18 may be disposed within body region 13, as was shown in FIG. 10.

A breakdown current flows through contact region 18, source electrode 16 and source pad electrode 65, to source wire 4. When avalanche breakdown occurs in region 3a, breakdown current $I_{br}$ has a shorter path than when breakdown occurs anywhere else. Thermal damage can thus be reduced. Accordingly, in a cell in region 3a, contact region 18 can have protruding portion 19 protruding from body region 13.

Figure 11:
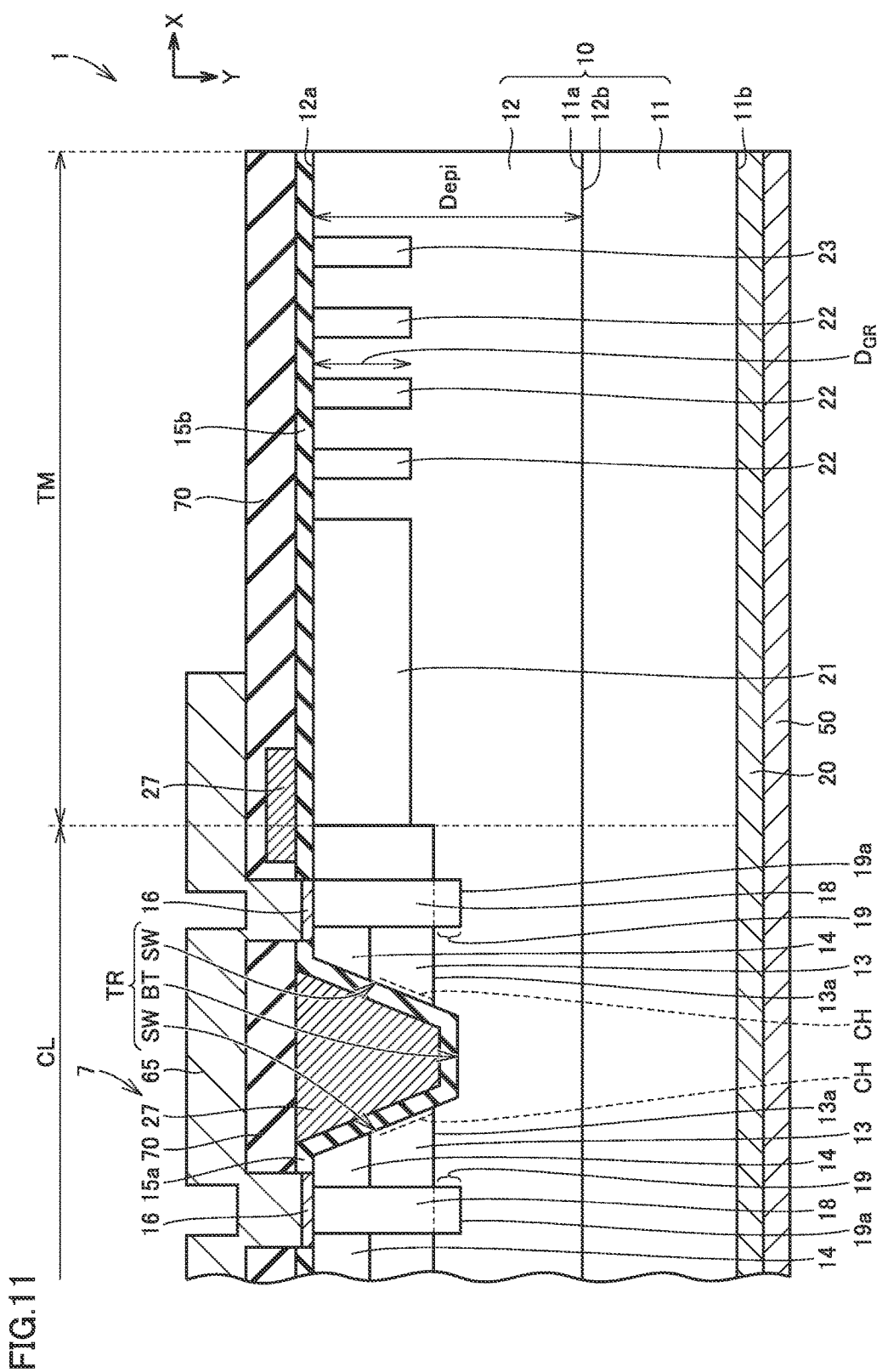
FIG. 11 is a sectional view showing another example of the silicon carbide semiconductor device according to the embodiment.

The above embodiment has described silicon carbide semiconductor device 1 as a planar type MOSFET. However, silicon carbide semiconductor device 1 according to this embodiment is not limited to the planar type MOSFET. As shown in FIG. 11, silicon carbide semiconductor device 1 may be a trench type MOSFET, for example. A trench TR has sides SW and a bottom BT. From first main surface 12a of drift layer 12, each of sides SW extends through source region 14 and body region 13, and reaches the interior of drift layer 12. In other words, a junction surface between body region 13 and drift layer 12 intersects sides SW.

Each of sides SW is covered with gate insulating film 15a. Channel region CH is formed in a portion of body region 13 which is in contact with gate insulating film 15a (a portion of body region 13 which is sandwiched between source region 14 and drift layer 12).

Each of sides SW is a surface inclined with respect to first main surface 12a of drift layer 12 so as to extend toward second main surface 12b of drift layer 12. Two opposed sides SW are tapered to expand toward first main surface 12a of drift layer 12.

Each of sides SW has a predetermined crystal plane (also referred to as a special plane) at a portion over body region 13. The "special plane" is a plane including a first plane having a plane orientation of {0-33-8}. More preferably, the special plane microscopically includes the first plane, and further microscopically includes a second plane having a plane orientation of {0-11-1}. More preferably, the first plane and the second plane include a combined plane having a plane orientation of {0-11-2}. The special plane can also be defined as a plane macroscopically having an off angle of 62°±10° relative to the {000-1} plane. The term "macroscopically" means disregarding a fine structure having a size of approximately interatomic spacing. For the measurement of such a macroscopic off angle, a method employing general X-ray diffraction can be used, for example.

The type of silicon carbide semiconductor device 1 is not limited to the MOSFET as long as it has an impurity region (protruding portion 19) connected to the bottom of body region 13. For example, silicon carbide semiconductor device 1 may be, but not limited to, an IGBT (Insulated Gate Bipolar Transistor), a JFET (Junction Field Effect Transistor), a bipolar transistor, or a Schottky barrier diode.

Although the above embodiment has described the first conductivity type as n type and the second conductivity type as p type, the first conductivity type may be p type and the second conductivity type may be n type.

It should be understood that the embodiments disclosed herein are illustrative and non-restrictive in every respect. The scope of the present invention is defined by the terms of the claims, rather than the embodiments above, and is intended to include any modifications within the scope and meaning equivalent to the terms of the claims.

REFERENCE SIGNS LIST 1 silicon carbide semiconductor device; 2 gate pad; 2a, 3a region; 3 source pad; 4 source wire; 10 silicon carbide substrate; 11 silicon carbide single-crystal substrate; 11a first main surface (silicon carbide single-crystal substrate); 11b second main surface (silicon carbide single-crystal substrate); 12 drift layer; 12a first main surface (drift layer); 12b second main surface (drift layer); 13 body region; 13a bottom (body region); 14 source region; 15a gate insulating film; 15b insulating film; 16 source electrode; 18 contact region; 19 protruding portion; 19a bottom (protruding portion); 20 drain electrode; 22 guard ring region; 23 field stop region; 27 gate electrode; 30 opening; 50 backside protection electrode; 65 source pad electrode; 70 interlayer insulating film; CH channel region; CL element region; BT bottom (trench); $D_{DP}$, $D_{GR}$, $D_{JTE}$, $D_{P+}$, $D_{PB}$, Depi thickness; $I_{br}$ breakdown current; SW side; TM termination region; TR trench; Vd drain voltage; Vg gate voltage; Vs source voltage.

The invention claimed is:

1. A silicon carbide semiconductor device comprising:
a silicon carbide substrate having a first main surface and a second main surface located opposite to the first main surface, the silicon carbide substrate including
a first impurity region in contact with the first main surface and having a first conductivity type,
a second impurity region located in the first impurity region, in contact with the first main surface, and having a second conductivity type different from the first conductivity type,
a third impurity region having the second conductivity type and connected to a bottom of the second impurity region,
an electric field relaxing region having the second conductivity type, located adjacent to the second impurity region, and having an impurity concentration lower than an impurity concentration in the third impurity region, and
at least one guard ring region having the second conductivity type, located opposite to the second impurity region with the electric field relaxing region interposed therebetween, and having an impurity concentration lower than the impurity concentration in the third impurity region,
the silicon carbide semiconductor device further comprising:
an oxide film located on the first main surface of the silicon carbide substrate, and having an opening to expose the second impurity region;
a first electrode electrically connected to the second impurity region through the opening; and
a second electrode electrically connected to the second main surface of the silicon carbide substrate, wherein
with the first main surface as a depth reference position, the electric field relaxing region and the at least one guard ring region are shallower than the second impurity region.

2. The silicon carbide semiconductor device according to claim 1, wherein
the silicon carbide semiconductor device further comprises a plurality of cells, each of the plurality of cells including the second impurity region and the third impurity region, and
the plurality of cells have a same concentration profile of the impurity of the second conductivity type in the third impurity region along a depth direction from the first main surface.

3. The silicon carbide semiconductor device according to claim 1, wherein
a difference in depth from the first main surface between the bottom of the second impurity region and the bottom of the third impurity region is not less than 0.1 µm.

4. The silicon carbide semiconductor device according to claim 1, wherein
the impurity of the second conductivity type in the third impurity region has a concentration of not more than $1\times10^{19}$ cm$^{-3}$.

5. The silicon carbide semiconductor device according to claim 1, wherein
a dose amount of the impurity of the second conductivity type in the electric field relaxing region is not less than $0.5\times10^{13}$ cm$^{-2}$ and not more than $5\times10^{13}$ cm$^{-2}$.

6. A silicon carbide semiconductor device comprising:
a silicon carbide substrate having a first main surface and a second main surface located opposite to the first main surface, the silicon carbide substrate including
a first impurity region in contact with the first main surface and having a first conductivity type,
a second impurity region located in the first impurity region, in contact with the first main surface, and having a second conductivity type different from the first conductivity type,
a third impurity region having the second conductivity type and connected to a bottom of the second impurity region,
an electric field relaxing region having the second conductivity type, located adjacent to the second impurity region, and having an impurity concentration lower than an impurity concentration in the third impurity region, and
at least one guard ring region having the second conductivity type, located opposite to the second impurity region with the electric field relaxing region interposed therebetween, and having an impurity concentration lower than the impurity concentration in the third impurity region,
the silicon carbide semiconductor device further comprising:
an oxide film located on the first main surface of the silicon carbide substrate, and having an opening to expose the second impurity region;
a first electrode electrically connected to the second impurity region through the opening; and
a second electrode electrically connected to the second main surface of the silicon carbide substrate, wherein
a depth of a bottom of the third impurity region from the first main surface is not less than 0.9 µm.

7. The silicon carbide semiconductor device according to claim 6, wherein
a difference in depth from the first main surface between the bottom of the second impurity region and the bottom of the third impurity region is not less than 0.1 µm.

8. The silicon carbide semiconductor device according to claim 6, wherein
the impurity of the second conductivity type in the third impurity region has a concentration of not more than $1\times10^{19}$ cm$^{-3}$.

9. The silicon carbide semiconductor device according to claim 6, wherein
a dose amount of the impurity of the second conductivity type in the electric field relaxing region is not less than $0.5\times10^{13}$ cm$^{-2}$ and not more than $5\times10^{13}$ cm$^{-2}$.

10. A method of manufacturing a silicon carbide semiconductor device, comprising:
preparing a silicon carbide substrate having a first main surface and a second main surface located opposite to the first main surface, the silicon carbide substrate including a first impurity region in contact with the first main surface and having a first conductivity type; and
forming, in the first impurity region, by ion implantation, a second impurity region, a third impurity region, an electric field relaxing region, and at least one guard ring region, each region having a second conductivity type different from the first conductivity type, the second impurity region being located in the first impurity region and in contact with the first main surface, the third impurity region being connected to a bottom of the second impurity region, the electric field relaxing region being located adjacent to the second impurity region, and having an impurity concentration lower than an impurity concentration in the third impurity region, and the at least one guard ring region being located opposite to the second impurity region with the electric field relaxing region interposed therebetween, and having an impurity concentration lower than the impurity concentration in the third impurity region, the method of manufacturing a silicon carbide semiconductor device further comprising:

forming an oxide film on the first main surface of the silicon carbide substrate by thermal oxidation of the silicon carbide substrate;

forming an opening in the oxide film so as to expose the second impurity region;

forming a first electrode electrically connected to the second impurity region through the opening; and forming a second electrode electrically connected to the second main surface of the silicon carbide substrate, wherein in the forming, with the first main surface as a depth reference position, the electric field relaxing region and the at least one guard ring region are formed to be shallower than the second impurity region.

11. The method of manufacturing a silicon carbide semiconductor device according to claim 10, wherein the silicon carbide semiconductor device further includes a plurality of cells, each of the plurality of cells including the second impurity region and the third impurity region, and in the forming, the third impurity region is formed such that the plurality of cells have a same concentration profile of the impurity of the second conductivity type in the third impurity region along a depth direction from the first main surface.

12. The method of manufacturing a silicon carbide semiconductor device according to claim 10, wherein a depth of a bottom of the third impurity region from the first main surface is not less than 0.9 μm.

13. The method of manufacturing a silicon carbide semiconductor device according to claim 10, wherein a difference in depth from the first main surface between the bottom of the second impurity region and the bottom of the third impurity region is not less than 0.1 μm.

14. The method of manufacturing a silicon carbide semiconductor device according to claim 10, wherein the impurity of the second conductivity type in the third impurity region has a concentration of not more than $1 \times 10^{19}$ cm$^{-3}$.

15. The method of manufacturing a silicon carbide semiconductor device according to claim 10, wherein in the forming, a dose amount of the impurity of the second conductivity type in the electric field relaxing region is not less than $0.5 \times 10^{13}$ cm$^{-2}$ and not more than $5 \times 10^{13}$ cm$^{-2}$.

* * * * *